United States Patent [19]

Nara et al.

[11] Patent Number: 5,565,988
[45] Date of Patent: Oct. 15, 1996

[54] ALIGNMENT METHOD AND APPARATUS

[75] Inventors: Kei Nara, Yokohama; Nobutaka Fujimori, Fujisawa, both of Japan

[73] Assignee: Nikon Corporation, Tokyo, Japan

[21] Appl. No.: 384,953

[22] Filed: Feb. 7, 1995

[30] Foreign Application Priority Data

Feb. 9, 1994 [JP] Japan .................................. 6-037579

[51] Int. Cl.$^6$ .................................................. G01B 11/00
[52] U.S. Cl. ........................................ 356/401; 250/559.3
[58] Field of Search ........................... 356/399–401; 250/548, 559.2, 559.3; 358/43, 53

[56] References Cited

U.S. PATENT DOCUMENTS

4,769,523  9/1988  Tanimoto et al. ................. 356/401
4,937,459  6/1990  Ina ..................................... 356/401

Primary Examiner—K. Hantis
Attorney, Agent, or Firm—Shapiro and Shapiro

[57] ABSTRACT

In an alignment method an apparatus for scanning an alignment mark formed on a substrate with a beam of light, and detecting the position of the alignment mark on the basis of a signal conforming to reflected light obtained from the alignment mark, a dummy mark of the same shape as the alignment mark is formed near the alignment mark formed on the substrate, the dummy mark and the alignment mark are continuously scanned by the beam of light, and during the time from after the beam of light has scanned the dummy mark until the scanning of the alignment mark is started, the intensity (signal level) of a first signal obtained in conformity with reflected light reflected by the dummy mark is found to thereby calculate the amplification factor of the signal, and during the scanning of the alignment mark, a second signal obtained in conformity with reflected Light reflected from the alignment mark is amplified with this amplification factor, and the position of the alignment mark is detected on the basis of the amplified second signal.

8 Claims, 8 Drawing Sheets

ND APPARATUS

BACKGROUND OF THE INVENTION

1. Field of the Invention

This invention relates to an alignment method and an alignment apparatus and is applicable, for example, to the detection of the position of an alignment mark used for the alignment of a mask and a wafer.

2. Related Background Art

Figure 6:
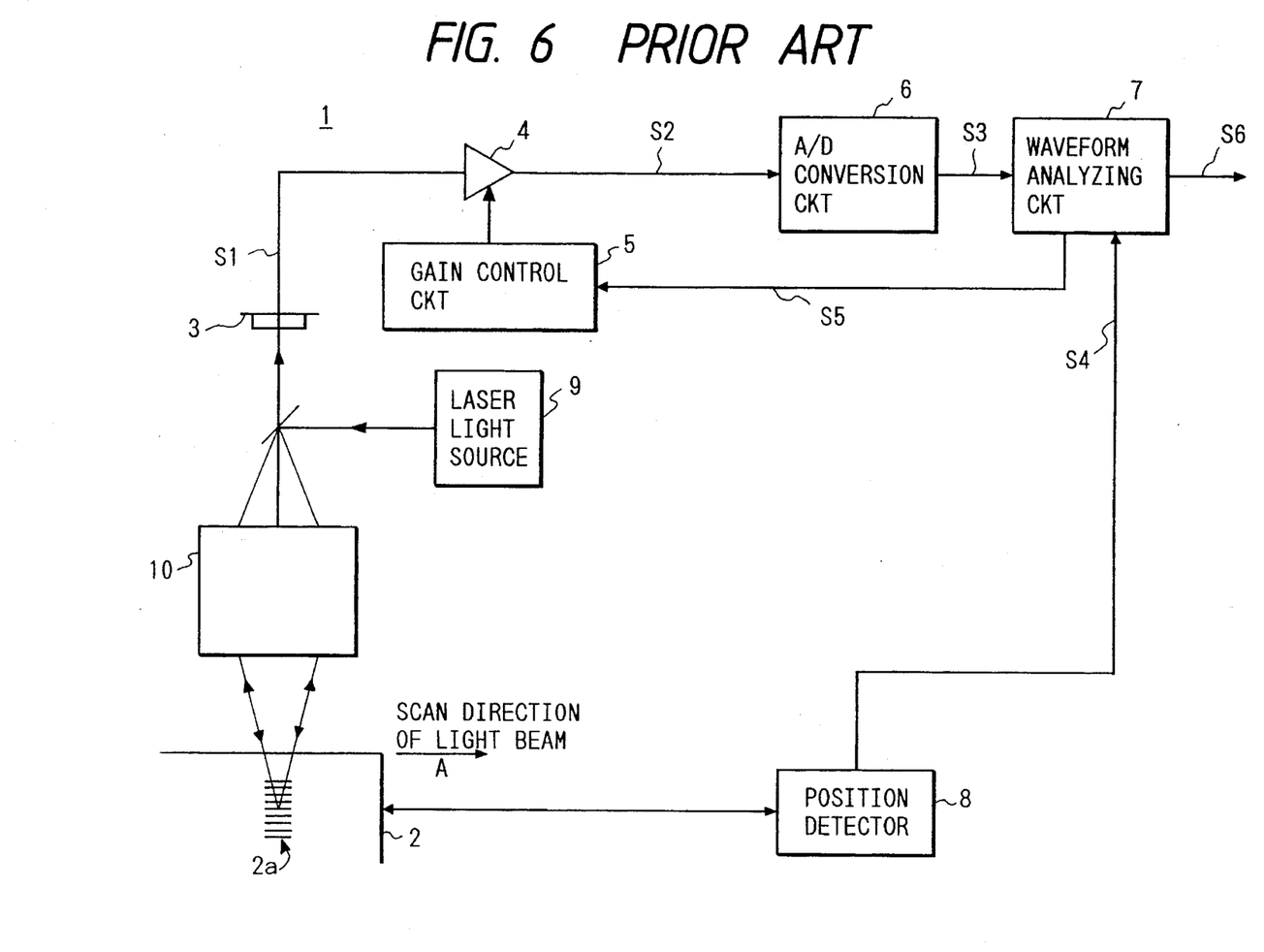
FIG. 6 is a block diagram showing an alignment apparatus according to the prior art.

An alignment mark detecting system 1 as shown in FIG. 6 of the accompanying drawings has heretofore been used in an exposure apparatus for manufacturing liquid crystal substrates or the like. This alignment mark detecting system applies a laser beam from a laser source 9 as alignment light to a substrate 2 placed on a stage through an optical system 10. By scanning the substrate 2 with the alignment light, the alignment light scans over an alignment mark 2a formed on the substrate 2, in the direction of arrow A.

Diffracted light reflected by the alignment mark 2a enters a detector 3 through the optical system 10 and is given as a received light signal S1 to a preamplifier 4. The gain of the preamplifier 4 is variably controlled by a gain control circuit 5, and the preamplifier 4 amplifies the detection signal S1 in conformity with a set gain and outputs an analog signal S2 of a suitable magnitude to an analog-digital conversion circuit (A/D) 6. The analog-digital conversion circuit 6 converts amplified signal S2 into a digital signal S3 and gives it to a waveform analyzing circuit 7.

The waveform analyzing circuit 7 detects the peak of the waveform (corresponding to the center of the alignment mark) from the digital signal S3, and calculates the coordinates of the center of the alignment mark on the basis of the coordinates information S4 of the substrate 2 obtained from a position detector 8.

The signal level of the analog signal S2 provided by the preamplifier 4 to the analog-digital conversion circuit 6 is not always of a magnitude suitable for the calculation of the coordinates of the center based on a single scan. So, heretofore, the alignment mark 2a has been twice scanned to thereby find the coordinates of the center of the alignment mark 2a.

That is, when the peak value of the signal waveform obtained from the digital signal S3 during the first scan is not an appropriate signal level, the waveform analyzing circuit 7 calculates again necessary to provide an appropriate peak value, and gives this gain as again signal S5 to the gain control circuit 5. It then calculates the coordinates of the center of the mark in such a manner that during the second scan, the peak value of the signal waveform becomes an appropriate signal level, and outputs them as center coordinates information S6.

Figure 7:
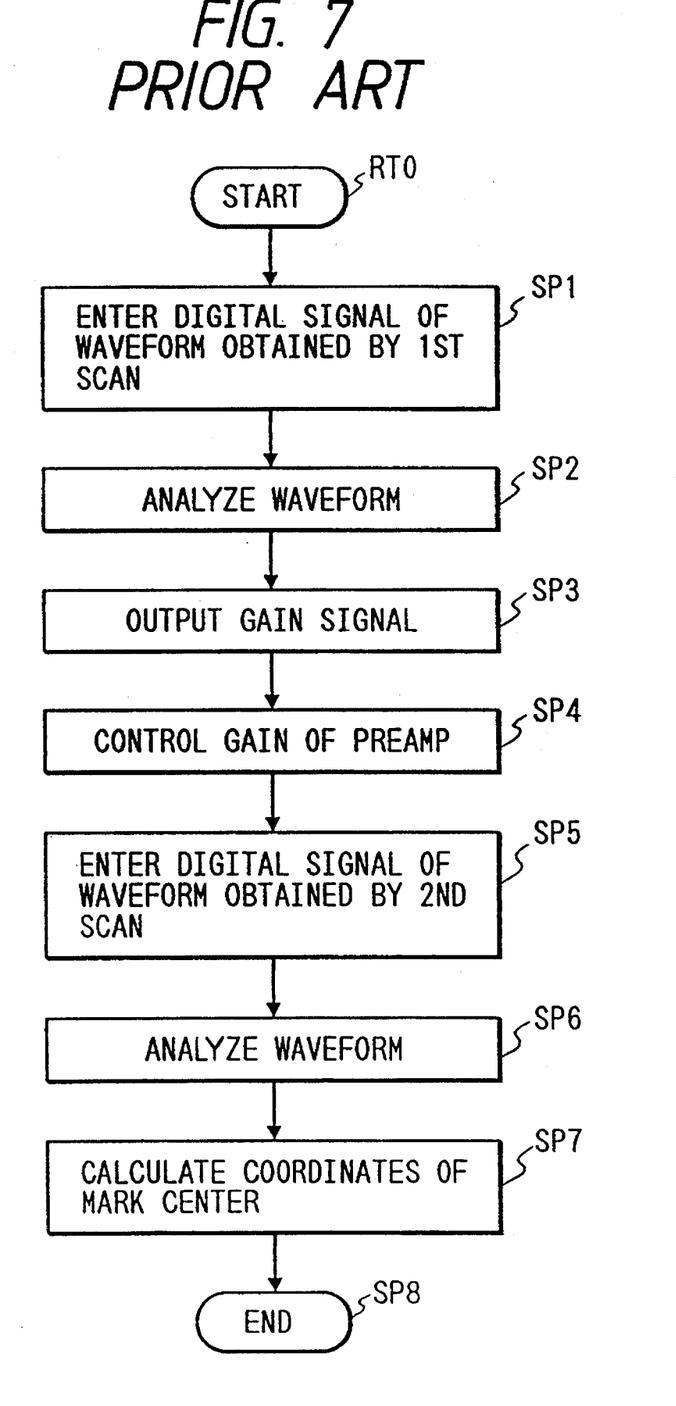
FIG. 7 is a flow chart showing an alignment procedure according to the prior art.
Figure 8A:
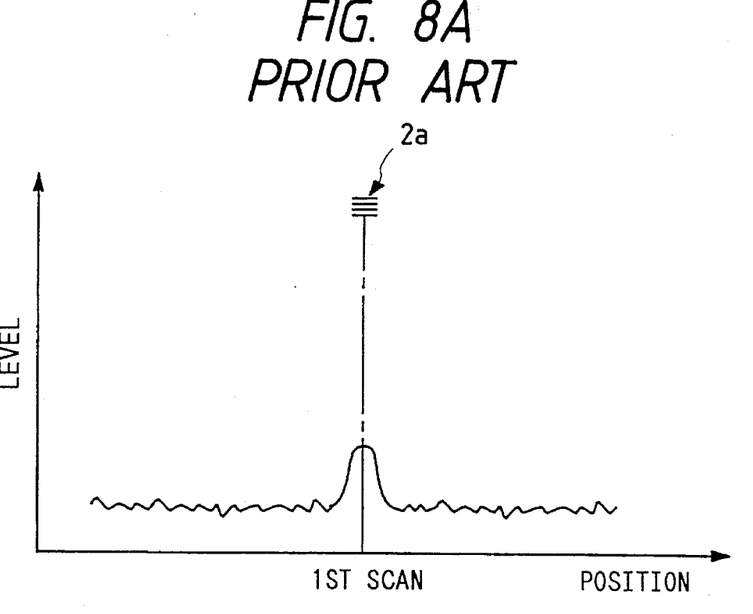
FIG. 8A shows an analog signal waveform obtained in the first scan when an alignment method according to the prior art is used.

This process of the waveform analyzing circuit 7, if represented by a flow chart, is such as shown in FIG. 7 of the accompanying drawings. That is, as a step SP1, the digital signal S3 of the signal waveform obtained by the first scan is entered, and at the next step SP2, the waveform is analyzed. The signal waveform at this time is shown in FIG. 8A of the accompanying drawings. The peak of the signal waveform is detected by the result of this analysis, and a gain for obtaining an appropriate signal level is calculated at a step SP3. Thereafter, at a step SP4, the gain of the preamplifier 4 is set to an appropriate value.

Figure 8B:
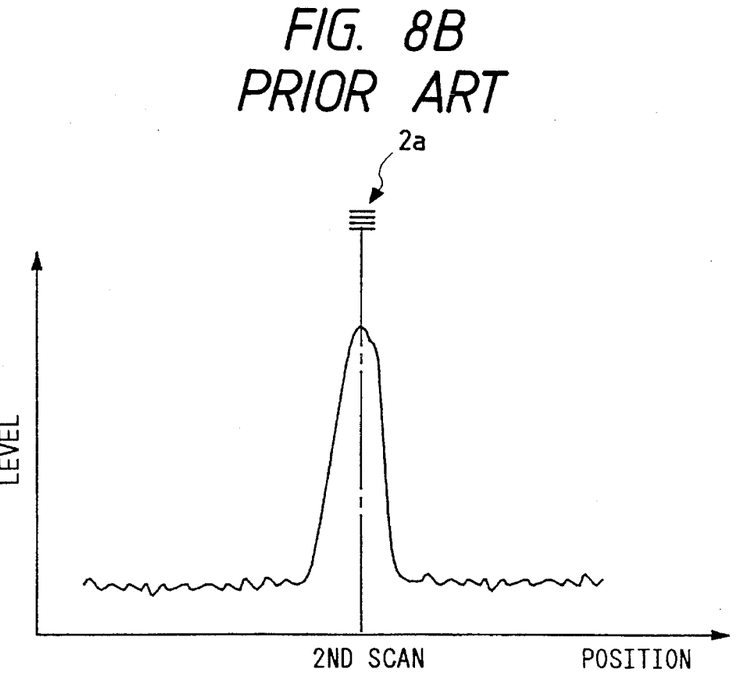
FIG. 8B shows an analog signal waveform obtained in the second scan when the alignment method according to the prior art is used.

After these processes, the second scan is effected, and at a step SP5, the digital signal S3 of the signal waveform obtained by the second scan is entered. The signal waveform at this time is shown in FIG. 8B of the accompanying drawings. At a step SP6, the waveform of the analog signal S2, amplified by the gain obtained at the step SP3, is analyzed. At the next step SP7, the coordinates of the center of the alignment mark 2a are calculated from the result of this analysis.

However, in the above-described method, it is necessary to repeat the scan (that is, scan twice) each time the alignment mark is aligned, and this has led to the problem that for the entire substrate, the time required for alignment becomes long.

SUMMARY OF THE INVENTION

The present invention has been made in view of the above-noted points and an object thereof is to provide an alignment method and an alignment apparatus capable of detecting the position of an alignment mark formed on a substrate within a short time.

In order to solve such a problem, according to the present invention, in an alignment method of scanning an alignment mark formed on a substrate by a beam of light, and detecting the position of the alignment mark on the basis of a signal conforming to reflected light obtained from the alignment mark, a dummy mark of the same shape as the alignment mark is formed near the alignment mark formed on the substrate, the dummy mark and the alignment mark are continuously scanned by a beam of light, and during the time from after the beam of light has scanned the dummy mark until the scanning of the alignment mark is started, the intensity (signal level) of a first signal obtained in conformity with reflected light reflected by the dummy mark is found to thereby calculate the amplification factor of the signal, and during the scanning of the alignment mark, a second signal obtained in conformity with reflected light reflected from the alignment mark is amplified with this amplification factor, and the position of the alignment mark is detected on the basis of the signal after amplified.

Also, according to the present invention, in an alignment apparatus for scanning an alignment mark formed on a substrate by a beam of light, and detecting the position of the alignment mark on the basis of a signal conforming to reflected light obtained from the alignment mark, a dummy mark of the same shape as the alignment mark is disposed on the substrate near the alignment mark, and provision is made of calculating means for calculating an amplification factor on the basis of a first signal conforming to reflected light obtained from the dummy mark when the dummy mark and the alignment mark are continuously scanned by the beam of light, so that the level of a second signal conforming to the reflected light obtained from the alignment mark may become a predetermined level, signal amplifying means for amplifying the second signal conforming to the reflected light obtained from the alignment mark, in conformity with a gain set on the basis of said amplification factor, and position detecting means for detecting the position of the alignment mark in conformity with the amplified signal.

As described above, according to the present invention, the dummy mark and alignment mark formed on the substrate are continuously scanned by a beam of light, and during the time from after the beam of light has scanned the dummy mark until it scans the alignment mark, a signal is obtained from the dummy mark and an amplification factor is calculated, and after the scanning of the alignment mark has been started, a signal obtained from the alignment mark is amplified by the previously calculated amplification factor, whereby a signal of a predetermined level necessary for the detection of the position of the alignment mark can be obtained. Therefore, the position of the alignment mark can be detected by one cycle of scanning and the time required for alignment can be shortened as compared with the prior art.

Figure 1:
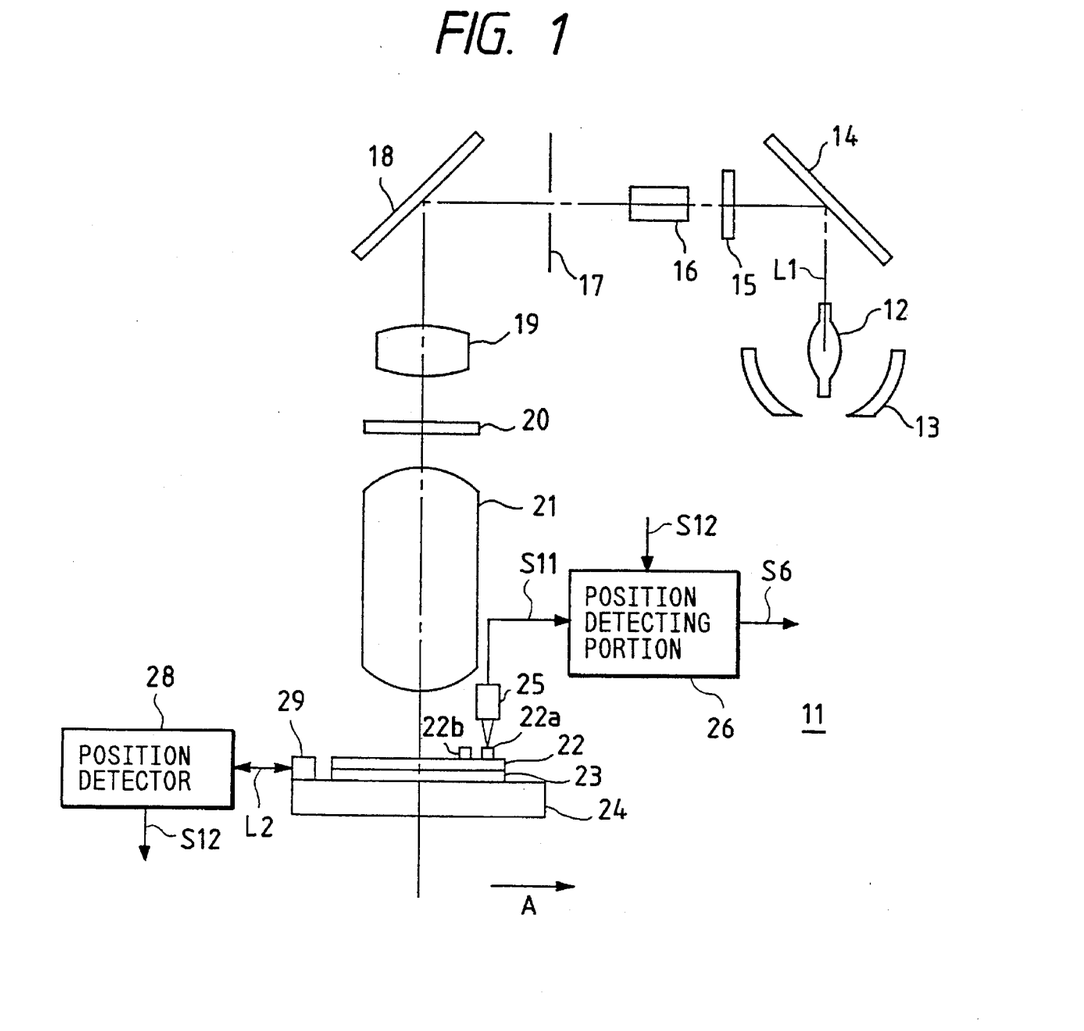
FIG. 1 schematically shows the construction of an exposure apparatus provided with an alignment apparatus according to the present invention.

DESCRIPTION OF THE PREFERRED EMBODIMENTS (1) General Construction of Exposure Apparatus FIG. 1 shows an exposure apparatus provided with an alignment apparatus according to the present invention. This exposure apparatus 11 is designed such that a beam of light L1 emitted from a light source 12 for exposure is condensed by an elliptical mirror 13, whereafter it is directed to a wavelength selecting filter 15 via a mirror 14 and only wavelengths necessary for exposure (generally g-ray and i-ray) are transmitted. Further, the transmitted light is converted into a beam of light having a uniform illuminance distribution by a fly-eye integrator 16, and a beam of light set in any illuminated area is applied onto a reticle 20 through the intermediary of a blind 17, a mirror 18 and a condenser lens 19 in succession. Design is made such that a pattern on the illuminated reticle 20 is imaged on a substrate 22 through a projection lens 21.

This substrate 22 is placed on a levelling stage 23 and can be driven in a direction orthogonal to the optical axis by a stage 24 provided on the lower portion of the levelling stage 23. The exposure apparatus 11 is designed such that alignment light such as a laser beam is applied from an alignment system 25 onto the substrate 22, and during alignment, the substrate 22 is horizontally driven, whereby an alignment mark 22a formed on the substrate is scanned by the alignment light. At this time, the alignment light scans the alignment mark 22a in the direction of arrow A. That is, the substrate 22 is moved in a direction opposite to the direction of arrow A.

Now, a dummy mark 22b, in addition to the alignment mark 22a, is provided on the substrate 22. This dummy mark 22b comprises a pattern of the same shape of the alignment mark 22a and is adapted to reflect the alignment light with the same reflectance as that of the alignment mark. This dummy mark 22b is a mark for gain setting during alignment, and is adapted to be scanned earlier by the alignment light than the alignment mark 22a during alignment.

Diffracted light reflected by the alignment mark 22a and dummy mark 22b is received by a detector in an alignment system 25. A received light signal S11 is outputted from the alignment system 25 to a position detecting portion 26. The position detecting portion 26 is adapted to calculate the coordinates of the center of the alignment mark 22a on the basis of the received light signal S11 and positional information S12. Now, the positional information S12 is delivered from a position detector 28. The position detector 28 comprises a laser interferometer, and is adapted to apply a laser beam to a movable mirror 29 and a reference mirror, not shown, mounted on the stage 24, detect the current position (exactly the amount of movement) of the stage 24 on the basis of reflected light from those mirrors, and output this position as the positional information S12 to the position detecting portion 26.

(2) Construction of Position Detecting Portion 26

Figure 2:
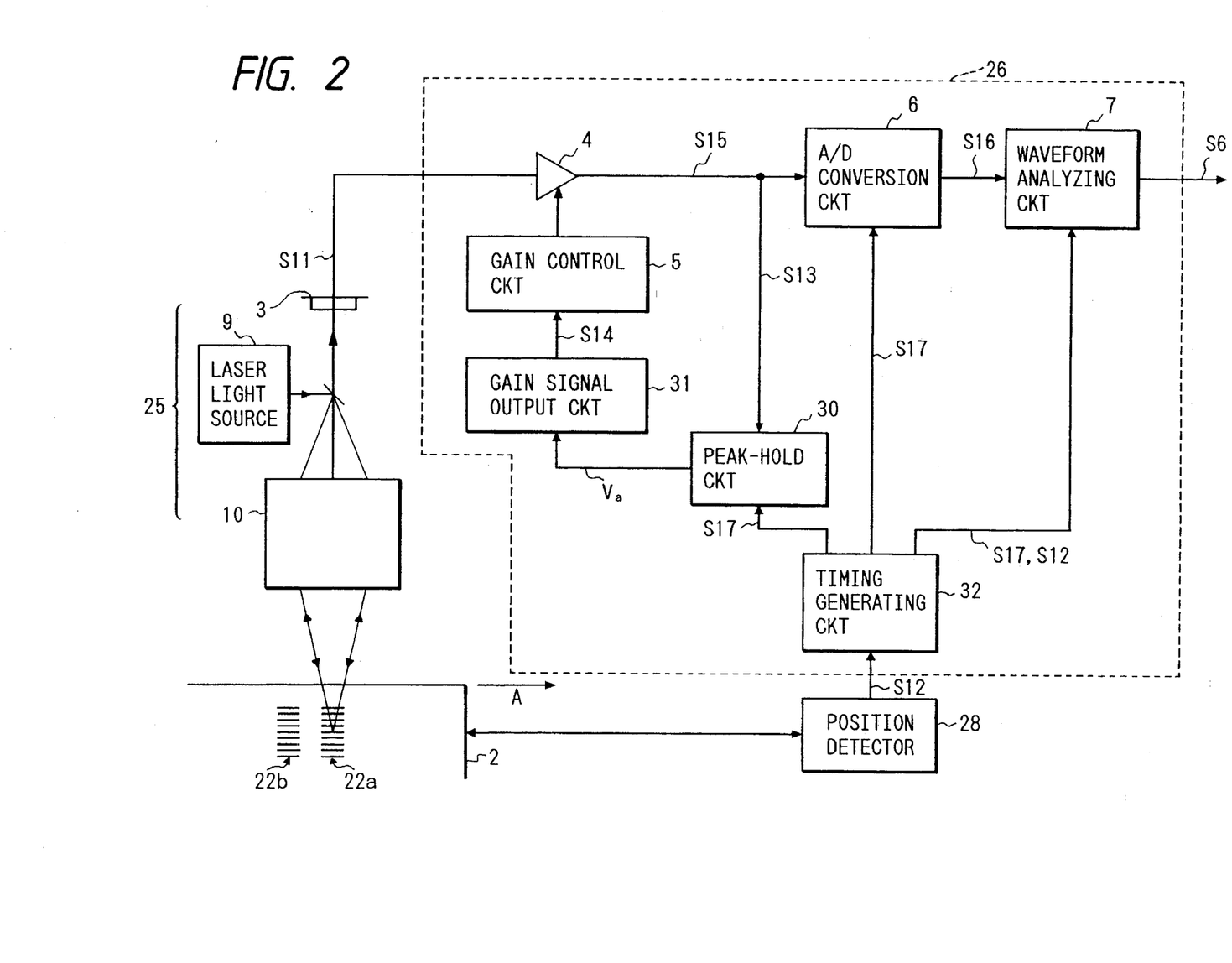
FIG. 2 is a block diagram showing an embodiment of the alignment apparatus according to the present invention.

The internal construction of the position detecting portion 26 will now be described with reference to FIG. 2 in which portions corresponding to those in FIG. 6 are given the same reference numerals. The position detecting portion 26 is adapted to effect the setting of an optimum gain and the calculation of the coordinates of the center of the alignment mark 22a by discrete circuit blocks so as to be able to calculate the coordinates of the center of the alignment mark 22a by one cycle of scan.

A circuit block for setting the gain of the preamplifier 4 to the optimum gain will first be described. This circuit block uses a received light signal (analog signal) S13 corresponding to the dummy mark 22b which is the first scanned of the two marks. Description will hereinafter be made of a peak-hold circuit 30, a gain signal output circuit 31 and a gain control circuit 5 which together constitute this circuit block.

The peak-hold circuit 30 enters the analog signal S13 amplified by the preamplifier 4, detects the peak level Va of this signal and sends it to the gain signal output circuit 31.

The gain signal output circuit 31 calculates a gain signal S14 providing signal intensity V optimum for waveform analysis by the following equation:

$$S14 = V/Va \qquad (1)$$

The gain control circuit 5 is adapted to send the thus calculated gain signal S14 to the preamplifier 4 to thereby variably control the gain.

On the other hand, a circuit block for calculating the coordinates of the center of the alignment mark 22a is constituted by an analog-digital conversion circuit 6 and a waveform analyzing circuit 7. This circuit block uses a received light signal S15 corresponding to the alignment mark 22a of the two marks. This circuit block is adapted to convert the analog signal S15 amplified to the optimum signal intensity into a digital signal S16 by the analog-digital conversion circuit 6, and analyze this digital signal S16 by the waveform analyzing circuit 7 to thereby calculate the coordinates of the center of the mark. Incidentally, the waveform analyzing circuit 7 is given coordinates information S12 together with a timing signal S17 from a timing generating circuit 32.

(3) Position Detecting Procedure

Figure 3:
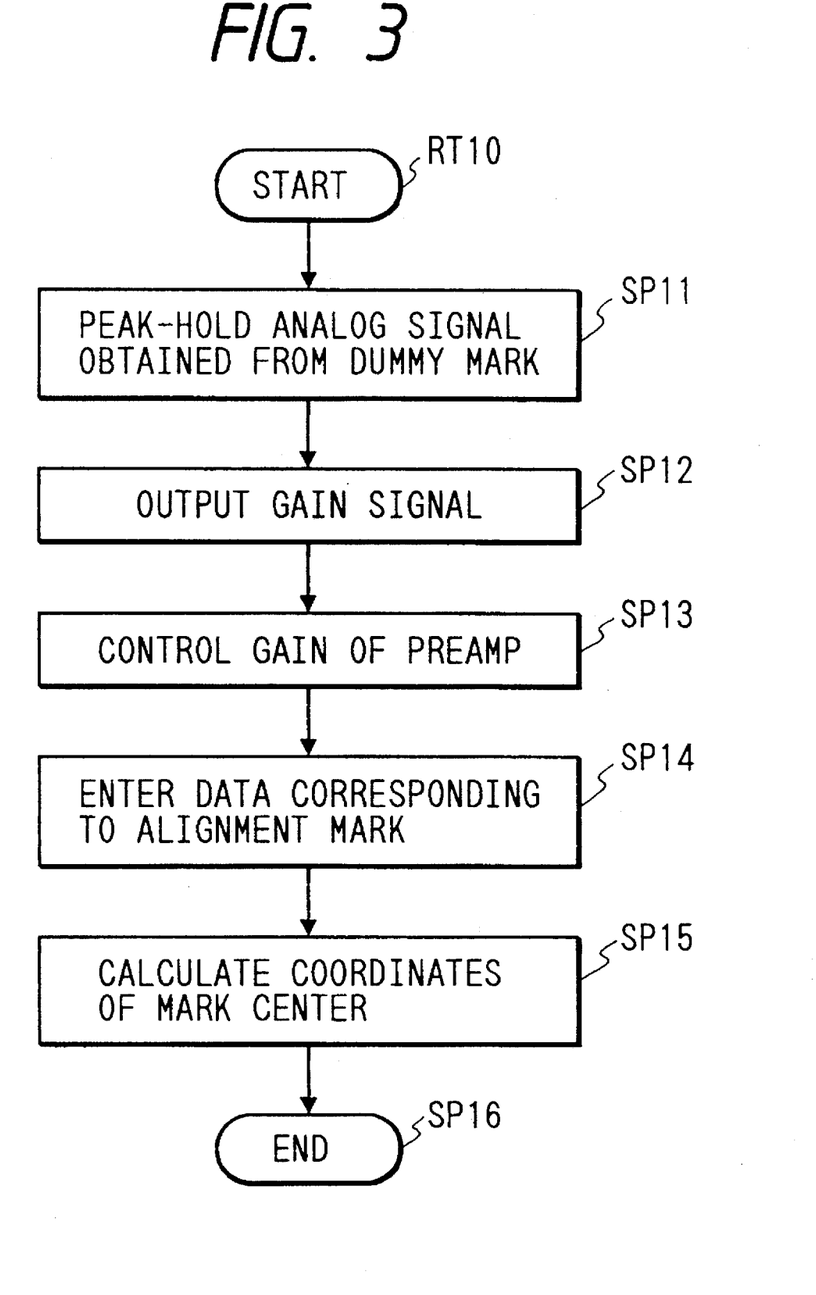
FIG. 3 is a flow chart showing an alignment procedure according to the present invention.
Figure 4:
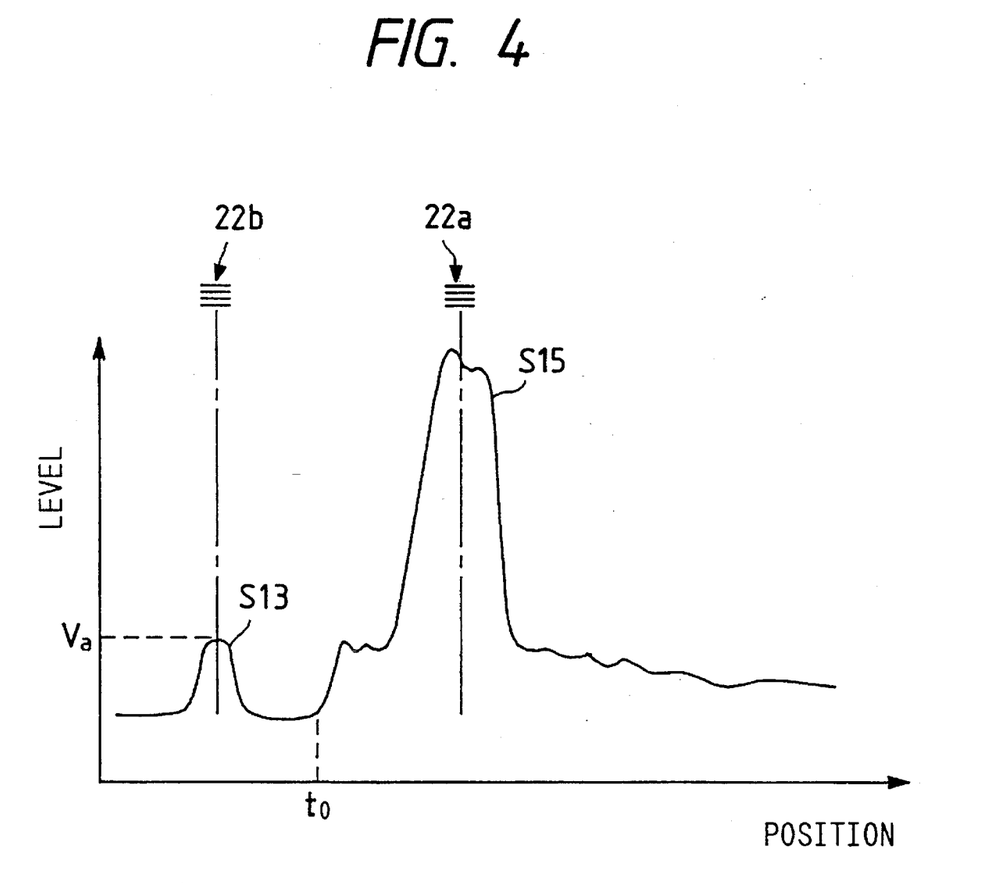
FIG. 4 is a signal waveform graph showing variations in an analog signal waveform obtained when an alignment method according to the present invention is used.

The manner of processing during alignment in the above-described construction will now be described with reference to FIGS. 3 and 4. With the start of alignment, the stage 24 is first horizontally driven and the alignment light emitted from the alignment system 25 begins to scan over the dummy mark 22b. At this time, the received light signal S11 from the dummy mark 22b received by the detector 3 is amplified with a predetermined gain by the preamplifier 4. At this point of time, however, the gain of the preamplifier 4 is not set to the optimum gain and therefore, the analog signal S13 of small amplitude as shown, for example, in FIG. 4 is outputted from an output end.

As the process of a step SP11, the peak value Va of the analog signal S13 is peak-held in the peak-hold circuit 30 while the dummy mark 22b is being scanned. Substantially simultaneously with the termination of the scanning of this dummy mark 22b, the calculation of the gain signal S14 at a step SP12 is effected. Here, the gain signal output circuit 31 calculates a gain signal S14 appropriate to the peak value Va by the use of equation (1). The process of setting the gain of the preamplifier 4 at a step SP13 is executed during the time from after the calculation of the gain signal S14 has been terminated until the scanning of the alignment mark 22a provided near the dummy mark 22b is started. The point of time at which these processes have been terminated corresponds to a point of time t0 in FIG. 4.

Subsequently, the alignment mark 22a begins to be scanned by the alignment light. At this point of time, the gain of the preamplifier 4 has already been set to the optimum gain and therefore, an analog signal S15 of great amplitude as shown in FIG. 4 is obtained at the output end of the preamplifier 4. At a step SP14, a digital signal S16 which is the result of the conversion of the analog signal S15 is entered into the waveform analyzing circuit 7, and at the next step SP15, the coordinates of the center of the alignment mark are calculated. Thus, the setting of the gain of the preamplifier 4 and the calculation of the position of the alignment mark 22a can be effected by only a single scan of the alignment light over the substrate.

According to the above-described construction, the dummy mark 22b for gain setting and the alignment mark 22a are provided on the substrate 22 along the scanning direction of the alignment light and the gain of the preamplifier 4 is set to the optimum level on the basis of the peak value of the analog signal S13 obtained during the scanning of the dummy mark 22b, whereby the coordinates of the center of the alignment mark 22a can be calculated during one cycle of scanning. As a result, the time required for alignment can be shortened as compared with the prior art. Thereby the throughput of the exposure apparatus 11 can be improved.

(4) Other Embodiments

While the above embodiment has been described with respect to a case where there is one alignment mark 22a, the present invention is not restricted thereto, but is also applicable to a case where a plurality of alignment marks are used. If a plurality of alignment marks are thus used, alignment accuracy could be more enhanced.

Also, the above embodiment has been described with respect to a case where the dummy mark 22b is formed into the same shape as the alignment mark 22a and the reflectance of the former is set so as to be equal to that of the latter, whereas the present invention is not restricted thereto. The shape of the pattern and reflectance of the dummy mark may differ from those of the alignment mark if it reflects a quantity of light substantially equal to the quantity of the reflected light from the alignment mark 22a. Incidentally, this is not restrictive when there is known such a relation that a gain appropriate for the detection of the alignment mark 22a can be set even if the quantity of the reflected light from the dummy mark 22b is not substantially equal to the quantity of the reflected light from the alignment mark 22a.

Further, the above embodiment has been described with respect to a case where in addition to the alignment mark 22a, the dummy mark 22b is newly formed on the substrate 22, whereas the present invention is not restricted thereto, but in a case where a substrate formed with a plurality of alignment marks is used during alignment, one of the plurality of alignment marks may be used as a dummy mark. The alignment mark used as a dummy mark in that case is an alignment mark which is first scanned by the alignment light.

Figure 5A:
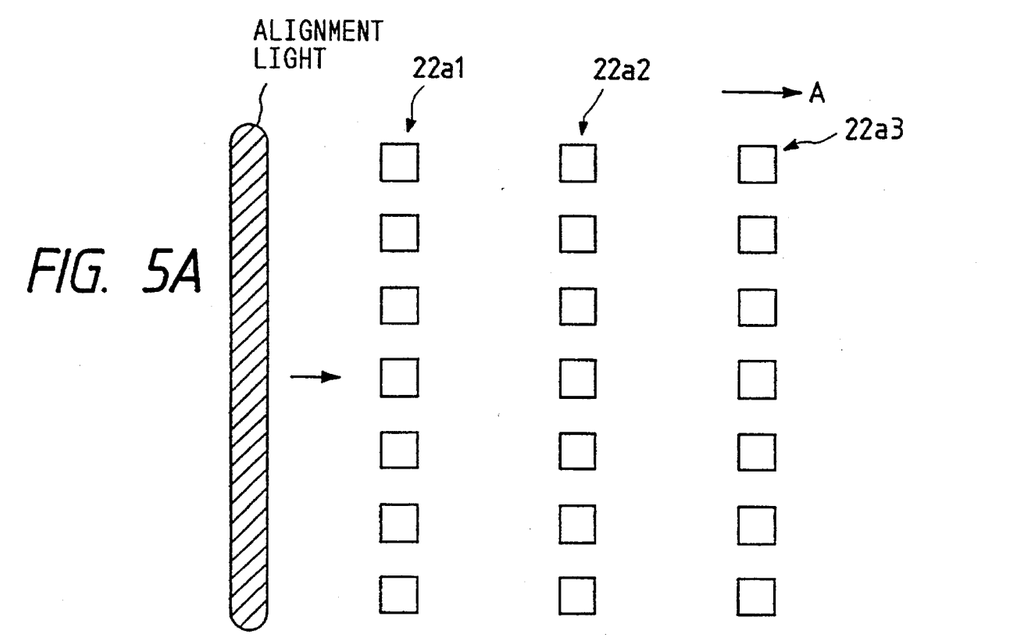
FIG. 5A shows the states of marks and alignment light when a plurality of alignment marks are used.
Figure 5B:
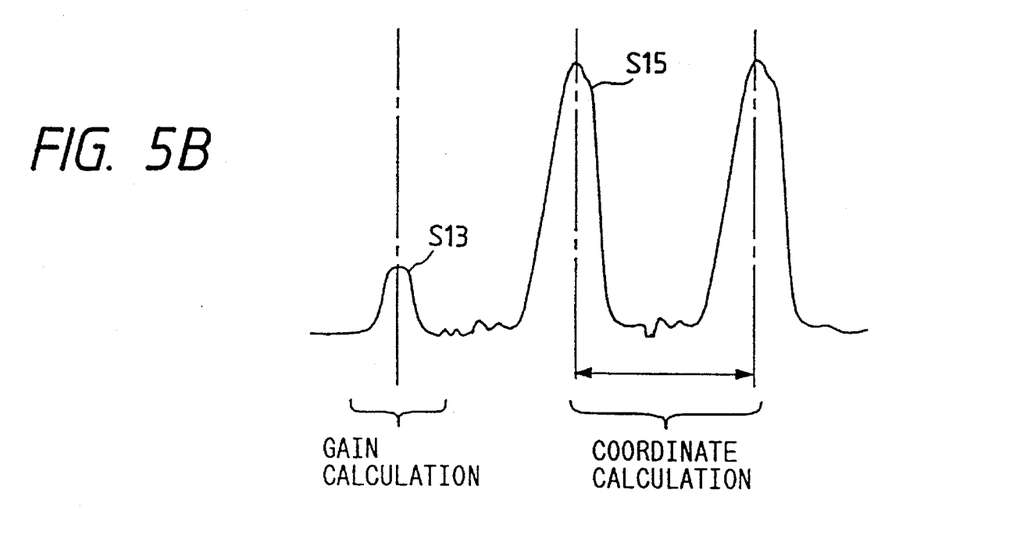
FIG. 5B is a signal waveform graph obtained by the use of an alignment method to which the present invention is applied when a plurality of alignment marks are used.

In a case where, as shown, for example, in FIGS. 5A and 5B, these alignment marks $22a^1$, $22a^2$ and $22a^3$ are formed on a substrate, the alignment mark $22a^1$ which is located most upstream with respect to the scanning direction of the alignment light (which is first scanned by the alignment light) may be used in place of the dummy mark 22b and the remaining alignment marks $22a^2$ and $22a^3$ may be used for the calculation of the coordinates of the alignment marks. In this case, the reticle heretofore used can be intactly used and therefore, the throughput of the exposure apparatus can be improved without the mark of the reticle being specially changed.

Also, the above embodiment has been described with respect to a case where the alignment light is fixed and the substrate 22 is driven in a direction orthogonal to the optical axis, whereby the alignment mark 22a is scanned by the alignment light. However the present invention is not restricted thereto, but is also applicable to a case where the alignment light is driven relative to the substrate to thereby scan the alignment mark.

Further, the above embodiment has been described with respect to a case where the present invention is applied to the alignment of the substrate 22 which is a substrate to be exposed. However this is not restrictive, but the present invention is also applicable to the alignment of a mask (reticle) or the alignment of another substrate formed with a positioning mark.

Also, the above embodiment has been described with respect to a case where the present invention is applied to an exposure apparatus. However the present invention is not restricted thereto, but is also applicable to another apparatus with alignment function of a construction in which the position of a mark is detected on the basis of reflected light (including diffracted light) from the mark.

What is claimed is:

1. An alignment method of detecting the position of an alignment mark formed on a substrate and aligning said substrate based on the detected position, comprising the steps of:

providing a substrate having an alignment mark and a dummy mark formed thereon, said alignment mark and said dummy mark having substantially the same shape and substantially the same reflectance;

continuously scanning said dummy mark and said alignment mark with a beam of light;

detecting a first signal corresponding to light reflected by said dummy mark during a time in said continuous scanning between completion of the scanning of said dummy mark with said beam of light and a start of the scanning of said alignment mark with said beam of light;

finding an amplification factor for use when detecting a signal corresponding to light reflected by said alignment mark, based on the intensity of said first signal; and amplifying a second signal corresponding to light reflected by said alignment mark after the start of the scanning of said alignment mark in said continuous scanning with said amplification factor, and detecting the position of said alignment mark based on the amplified second signal.

2. An alignment method according to claim 1, wherein the quantity of light reflected by said dummy mark and the quantity of light reflected by said alignment mark when said beam of light is applied to said dummy mark and said alignment mark are substantially equal to each other.

3. An alignment method according to claim 1, wherein said step of finding includes calculating the amplification factor so that the level of said second signal may become a predetermined level.

4. An alignment method according to claim 1, wherein said step of providing includes providing a plurality of sets of alignment marks on said substrate, and said step of detecting a first signal includes using at least one set of said plurality of sets of alignment marks as said dummy mark.

5. An alignment apparatus for detecting the position of an alignment mark formed on a substrate and aligning said substrate based on the detected position, comprising:

a substrate having an alignment mark and a dummy mark formed thereon, said alignment mark and said dummy mark having substantially the same shape and substantially the same reflectance;

an irradiating device that applies a beam of light to said alignment mark and said dummy mark;

a moving device that moves said beam of light and said substrate relative to each other, said beam of light being applied to said dummy mark and said alignment mark by said movement in a continuous application;

a signal detector that detects a first signal corresponding to light reflected by said dummy mark during a time in said continuous application between completion of application of said beam of light to said dummy mark and a start of application of said beam of light to said alignment mark;

a calculator that finds an amplification factor for use when detecting a signal corresponding to light reflected by said alignment mark, based on the intensity of said first signal;

a signal amplifier that amplifies a second signal corresponding to light reflected by said alignment mark, in conformity with a gain set based on said amplification factor after the start of the application of said beam of light to said alignment mark in said continuous application; and a position detector that detects the position of said alignment mark based on the amplified second signal.

6. An alignment apparatus according to claim 5, wherein the quantity of light reflected by said dummy mark and the quantity of light reflected by said alignment mark when said beam of light is applied to said dummy mark and said alignment mark are substantially equal to each other.

7. An alignment apparatus according to claim 5, wherein said calculator calculates the amplification factor so that the level of said second signal may become a predetermined level.

8. An alignment apparatus according to claim 5, wherein a plurality of sets of alignment marks are formed on said substrate, and at least one set of said plurality of sets of alignment marks are used as said dummy mark.

* * * * *